US008377624B2

(12) United States Patent
Jarek et al.

(10) Patent No.: US 8,377,624 B2
(45) Date of Patent: *Feb. 19, 2013

(54) NEGATIVE-WORKING THERMAL IMAGEABLE ELEMENTS

(75) Inventors: Mathias Jarek, Northeim (DE); Domenico Balbinot, Osterode am Harz (DE)

(73) Assignee: Eastman Kodak Company, Rochester, NY (US)

( * ) Notice: Subject to any disclaimer, the term of this patent is extended or adjusted under 35 U.S.C. 154(b) by 352 days.

This patent is subject to a terminal disclaimer.

(21) Appl. No.: 12/412,400

(22) Filed: Mar. 27, 2009

(65) Prior Publication Data

US 2010/0248097 A1 Sep. 30, 2010

(51) Int. Cl.
*B41N 3/00* (2006.01)
*G03F 7/00* (2006.01)
*G03F 7/26* (2006.01)

(52) U.S. Cl. .................. 430/270.1; 101/453; 101/463.1; 430/286.1; 430/302

(58) Field of Classification Search ............... 430/270.1, 430/302; 101/450.1
See application file for complete search history.

(56) References Cited

U.S. PATENT DOCUMENTS

| | | | | |
|---|---|---|---|---|
| 5,609,980 | A | 3/1997 | Matthews et al. | |
| 5,948,591 | A * | 9/1999 | Vermeersch et al. | 430/270.1 |
| 6,030,750 | A | 2/2000 | Vermeersch et al. | |
| 6,110,644 | A | 8/2000 | Vermeersch et al. | |
| 6,692,890 | B2 | 2/2004 | Huang et al. | |
| 6,727,318 | B1 | 4/2004 | Mathauer et al. | |
| 7,041,427 | B2 * | 5/2006 | Loccufier et al. | 430/270.1 |
| 2001/0036592 | A1 * | 11/2001 | Hoshi et al. | 430/270.1 |
| 2002/0182529 | A1 * | 12/2002 | Hoshi et al. | 430/138 |
| 2003/0144379 | A1 | 7/2003 | Mitchell et al. | |
| 2003/0148207 | A1 * | 8/2003 | Maemoto et al. | 430/138 |
| 2006/0073418 | A1 * | 4/2006 | Wilkinson et al. | 430/302 |
| 2009/0183647 | A1 * | 7/2009 | Jarek | 101/454 |

FOREIGN PATENT DOCUMENTS

| | | | |
|---|---|---|---|
| EP | 0514145 | * | 5/1992 |
| EP | 0 514 145 | | 11/1992 |
| EP | 1 219 668 | A2 | 7/2002 |
| EP | 1 279 520 | A1 | 1/2003 |
| EP | 1 319 671 | | 6/2003 |
| EP | 1 642 714 | | 10/2007 |

OTHER PUBLICATIONS http://www.merriamwebster.com/dictionary/may. 2011.*
U.S. Appl. No. 12/017,366, filed Jan. 22, 2008, titled Imageable Elements With Coalescing Core-Shell Particles, by Mathias Jarek.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Negative-working imageable elements have a hydrophilic substrate and a single thermally-sensitive imageable layer. This layer can include an infrared radiation absorbing compound and polymeric particles that coalesce upon thermal imaging. These coalesceable polymeric particles comprise a thermoplastic polymer and a colorant to provide improved visible contrast between exposed and non-exposed regions in the imaged element, such as lithographic printing plates.

15 Claims, No Drawings

NEGATIVE-WORKING THERMAL IMAGEABLE ELEMENTS

FIELD OF THE INVENTION

This invention relates to negative-working imageable elements that use thermally coalesceable thermoplastic particles. The non-exposed areas are removed with a development step. The thermally coalesceable thermoplastic particles comprise an IR dye, contrast dye or other colorant and are disposed in the imageable layer to provide a hydrophobic image surface. This invention also relates to methods of using these imageable elements.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers that image in response to signals from a digital copy of the image in a computer a platesetter. This "computer-to-plate" technology has generally replaced the former technology where masking films were used to image the elements.

Thermal imaging has especially become important with digital imaging systems because of their stability to ambient light. The elements are designed to be sensitive to heat or infrared radiation and can be exposed using thermal heads or more usually, infrared laser diodes. Heat that is generated from this exposure can be used in a number of ways, for example, ablation to physical remove imaged areas, polymerization of photosensitive compositions, insolubilization by crosslinking polymers, rendering polymers alkaline solution soluble, decomposition, or coagulation of thermoplastic particles. Most of these imaging techniques require the use of alkaline developers to remove exposed (positive-working) or non-exposed (negative-working) regions of the imaged layer (s).

Thermally meltable or fusable particles having surface functional groups have been used in imageable elements as described for example, in U.S. Pat. No. 6,218,073 (Shimizu et al.), U.S. Pat. No. 6,509,133 (Watanabe et al.), and U.S. Pat. No. 6,627,380 (Saito et al.). Other meltable polymeric particles are described in U.S. Pat. No. 6,692,890 (Huang et al.).

Coalesceable thermoplastic polymeric particles dispersed within hydrophilic binders in imageable elements are described, for example, in U.S. Pat. No. 6,030,750 (Vermeersch et al.) and U.S. Pat. No. 6,110,644 (Vermeersch et al.).

Core-shell particles are used in imageable layers according to U.S. Pat. No. 5,609,980 (Matthews et al.) and coalesce upon thermal imaging. The shell of the particles is soluble or swellable in aqueous media.

EP 514,145A1 (Matthews et al.) describes thermally-sensitive imageable elements containing heat-softenable core-shell particles in the imaging layer. Such particles coalesce upon heating and the non-coalesced particles are removed using an alkaline developer. The shells of these particles are specifically non-water soluble at neutral pH 7.

A similar composition is described in EP 1,642,714A1 (Wilkinson et al.). Non-exposed particles are removed using a gum solution instead of an alkaline developer.

Copending and commonly assigned U.S. Ser. No. 12/017,366 (filed Jan. 22, 2008 by Jarek) describes the use of coalesceable core-shell polymeric particles in imageable elements.

Typically, a water-soluble IR dye or contrast dye is added to such particles in the coating formulation. The IR dye is responsible for heat conversion under IR radiation so that the particles coalesce and form an image. The contrast dye improves the color intensity that allows better quality control of exposed printing plates. The dyes build something like a matrix around the particles in the coating or they may fill the cavities among the particles.

There are several drawbacks of such dye additions:

a) For ideal coalescence, a complete melting up of the particle is required in order to form a smooth film. Under IR irradiation, the IR dye converts the heat at the particle surface from which it has to be transferred into the inner particle zones. This heat transfer takes time or consumes a lot of exposure energy.

b) The dyes are usually not chemically bonded or fixed in any other way with the particles and therefore can be readily extracted from the exposed and coalesced image particles during the development step or by press room chemicals (for example, blanket washes) during printing that can lead to a significant loss of color contrast.

c) Most contrast dyes, especially cyanine dyes, are relatively sensitive to oxidation that reduces the shelf life of printing plates. This can be seen from a color shift of the printing plates with increasing storage time from a greenish blue color to a brownish color tone.

d) As long as the contrast dyes are within the matrix of the particles, they can be regarded as an additive. Generally, any additives (in this case the dyes) in the coating except within the particles themselves diminish the coalescence of the particles. The higher the amount of these dyes, the lower the contact of the particles with each other or in other words the average distance between particles grows. Particles with reduced contact with each other show weaker coalescence which results in lower run length of the resulting printing plate. Further, if the additives are water-soluble, as it is the case for most contrast dyes, the coalesced polymer particles can be mechanically destabilized by extraction of the dyes, which again leads to shorter press run length.

SUMMARY OF THE INVENTION

This invention provides an imageable element comprising a substrate having a hydrophilic surface, and having thereon a single thermally-sensitive imageable layer comprising polymeric particles that coalesce upon thermal imaging, and optionally an infrared radiation absorbing compound, wherein the polymeric particles comprise a thermoplastic polymer and a colorant, for example an IR dye, contrast dye, or both.

This invention also provides a method of providing an image comprising:

A) thermally imaging the imageable element of this invention to provide an imaged element with exposed regions and non-exposed regions, the exposed regions comprising coalesced polymeric particles, and B) developing the imaged element to remove the non-exposed regions with an aqueous solution.

In embodiments of this invention, the imageable element is a lithographic printing plate precursor having a substrate having a hydrophilic surface and an imageable layer, and the polymeric particles comprise at least 50 weight % of the imageable layer and have an average particle size of from about 5 to about 250 nm. Optionally, an infrared radiation absorbing compound that is a infrared radiation dye, is present in the imageable layer in an amount of from about 1 to about 30 weight % based on imageable layer total dry weight.

One embodiment of this invention is a lithographic printing plate having an aluminum-containing substrate comprising a hydrophilic surface that is prepared by the method of this invention.

We have found that the problems described above are solved by incorporating colorant such as an IR dye, contrast dye, or both, at least partially into the coalesceable polymeric particles. Thus, the colorant is less a part of the imageable layer matrix (for example, in the binder) but can be predominantly (at least 50 weight %) within the particles where it can act more efficiently and is better protected against oxidation.

The introduction of IR and contrast dyes, for example, into the coalesceable polymeric particles can be done by adding them in an oil-soluble form to form a dispersion during particle formation (polymerization) where at the end of reaction the dyes are "dissolved" into the particles. Another way to incorporate the dyes into the particles is to use dyes with a polymerizable substituent that copolymerize with other monomers during polymerization to form the coalesceable polymeric particles. For example, certain IR and contrast dyes can be chemically reacted as side chains with the thermoplastic polymers composing the particles, or they can be incorporated as part of the polymer backbone. Furthermore, the colorant can also be introduced by swelling the polymeric particles in an aqueous solution with a solvent wherein the colorant can diffuse into the swollen particles. The solvent can be removed by distillation after the colorant has completely diffused into the polymeric particles.

DETAILED DESCRIPTION OF THE INVENTION

Definitions

Unless the context indicates otherwise, when used herein, the terms "imageable element", "negative-working imageable element", and "lithographic printing plate precursor" are meant to be references to embodiments of the present invention.

In addition, unless the context indicates otherwise, the various components described herein such as "polymeric particles", "colorant", "thermoplastic polymer", "infrared radiation absorbing compound", and similar terms also refer to mixtures of such components. Thus, the use of the article "a" or "an" is not necessarily meant to refer to only a single component.

By "single-layer" imageable element, we mean an imageable element of this invention that has only a single layer needed for providing an image. The thermoplastic particles, for example core-shell particles (defined below), would be located in this single imageable layer that is usually the outermost layer. However, such elements may comprise additional non-imaging layers on either side of the substrate and underneath the imageable layer.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "colorant" refers to contrast dyes as well as infrared radiation (IR) dyes as defined in more detail below in Structures A and B.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

The term "thermoplastic" as used in reference to polymeric polymers refers to heat softenable polymeric substances where the softening point is below the thermal degradation temperature.

As used herein, glass transition temperature is measured using differential scanning calorimetry (DSC).

Uses

The imageable elements described herein can be used in a number of ways such as precursors to lithographic printing plates as described in more detail below. However, this is not meant to be their only use. For example, the imageable elements can also be used as thermal patterning systems or to form microelectronic and microoptical devices, masking elements, and printed circuit boards.

Polymeric Particles

The polymeric particles useful in this invention are capable of coalescing upon thermal imaging. These polymeric particles comprise a thermoplastic polymer and one or more colorants (dyes) that have a $\lambda_{max}$ of from about 350 to about 1550 nm. Examples for such dyes include but are not limited to, IR-sensitive dyes and contrast dyes such as cyanines, anthraquinones, phthalocyanines, di- or triarylmethanes, diazoniums, styryles, mero-styryls, oxazines, and rhodamine dyes. It would be readily apparent to the person skilled in the art what other dye molecules could be used in the present invention. More specific examples of these colorants are provided in the formulae below and in the following publications, all of which are incorporated herein by reference:

Formulae:

formula A:

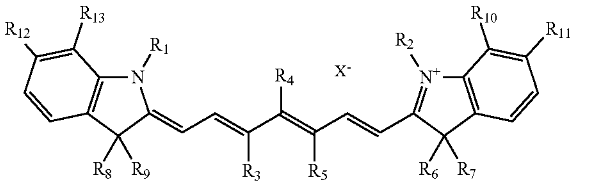

general formula for an IR dye formula B:

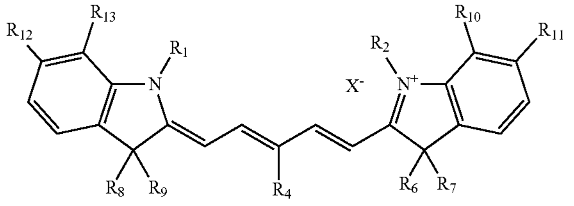

general formula for a cyanine contrast dye formula C:

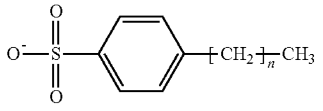

$X^-$ can be an oil soluble anion formula D:

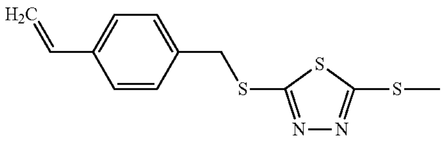

$R^4$ can be a reactive group

In the shown formulae, $R_1$, $R_2$, and $R_6$-$R_9$ can be independently substituted or unsubstituted alkyl groups, for example having a water-soluble group substituent such as, but not limited to, $—SO_3$, $—PO_4$, and $—NR_3$. $R_3$ or $R_5$, or both, can be substituted or unsubstituted alkyl, cyclic aliphatic, or aryl groups, $R_{10}$-$R_{13}$ independently can be substituted or unsubstituted alkyl, cyclic aliphatic, or aryl groups. Further, any of the groups $R_1$-$R_{13}$ can have a reactive polymerizable group such as shown in Formula D.

The anion $X^-$ can be $Cl^-$, $Br^-$, $I^-$, tosyl, mesityl, sulfo, sulfate, or a molecule as shown above in Formula C for example, and n is 0 or an integer of from 1 to 20.

In some embodiments, the colorant is covalently bonded using a linking group to the backbone of the thermoplastic polymer, but in other embodiments, the colorant is part of the polymer backbone. The colorant can be covalently bonded to the polymer backbone using known technology that is described for example in *J. of Pol. Sci. Part A*, Vol. 46, Issue 10, p. 3375f. Alternatively, the colorant can be incorporated into the backbone using other technology as described for example in U.S. Pat. No. 5,637,637 (Sharma et al.) and U.S. Pat. No. 5,102,764 (Rossi et al.). In other embodiments, the colorant can be dissolved or milled into the thermoplastic polymer before polymeric particles are created.

The colorant is present in the polymeric particles in an amount of at least 0.1 and up to 30 weight %, and typically from about 0.1 to about 20 weight %.

The thermoplastic polymer is chosen so that it has a glass transition temperature greater than room temperature or typically from about 40 to about 200° C. and thus can be melted or coalesced during thermal imaging that provides heating at a suitable temperature above the glass transition temperature.

For example, useful thermoplastic polymers include but are not limited to, polystyrenes (including substituted polystyrene), poly(meth)acrylates, polymethylenelactone, polyvinyl chloride, poly(meth)acrylonitriles, polyvinyl esters, polysulfone, polycarbonates, polyurethanes, polyamides, or copolymers thereof, or mixtures of any of these polymers. Such thermoplastic polymers can be readily prepared using known starting materials and reaction conditions and many can be purchased from a number of commercial sources.

In general, the polymeric particles containing the thermoplastic polymer have an average particle size of from about 5 to about 250 nm or from about 10 nm to about 150 nm.

The coalesceable polymeric particles used in this invention can be dispersed in a suitable hydrophilic binder that may or may not be crosslinked. In many embodiments, the hydrophilic binder is soluble in water or an aqueous solution. Examples of useful hydrophilic binders include homopolymers and copolymers derived from one or more vinyl alcohol, (meth)acrylamide, (meth)acrylic acid, and hydroxyethyl (meth)acrylate.

While many of the polymeric particles are homogeneous or essentially uniform in composition of thermoplastic polymer and colorant, other useful polymeric particles are provided as core-shell particles.

The core-shell particles useful in the practice of this invention typically have a hydrophobic polymer core containing one or more hydrophobic polymers. The useful hydrophobic polymers are "thermoplastic" meaning that they generally have a glass transition temperature of at least 40° C. or typically of at least 50° C. and thus can be melted or coalesced during thermal imaging that provides heating at a suitable temperature above the glass transition temperature. Useful hydrophobic thermoplastic polymers in the core include, but are not limited to polystyrenes, poly(meth)acrylates, polymethylenelactone, poly(meth)acrylonitrile, polyvinyl chloride, polyvinyl esters, polysulfone, polycarbonate, polyurethane, and polyamides. Representative polymers in these classes include polystyrene (and substituted polystyrenes), poly(methyl methacrylate), poly[methyl(meth)acrylate], polymethylenelactone, poly[(meth)acrylonitrile], and polyvinyl chloride.

The core generally has an average diameter of from about 10 to about 120 nm and typically from about 20 to about 100 nm, and the volume of the core polymer(s) comprises from about 75 to about 95% of the particle volume.

The shell of the useful core-shell particles is composed of one or more hydrophilic polymers that have reactive groups that can covalently bond with the hydrophobic polymer(s) of the core. In some instances, the shell polymers are "hydrophilic" in the sense that they are more water-loving than the core polymer(s). For example, the shell polymers can contain acidic groups, such as carboxy, sulfo, or phospho groups that have been partially or fully neutralized with a suitable base such as a hydroxide. For example, the shell polymers can contain carboxy groups and from about 5 to about 80 mol % of the carboxy groups have been neutralized with sodium hydroxide, potassium hydroxide, or ammonium hydroxide.

Thus, the shell polymer(s) can be derived at least in part from (meth)acrylic acid, tetrazole (meth)acrylate, (poly)ethylene glycol (meth)acrylate phosphates, phosphate (meth)acrylates, cyclic urea methacrylate (Plex-O 6850) vinyl phosphonic acid, and sulfonated (meth)acrylates, in combination with one or more (meth)acrylamides.

In some embodiments, the shell comprises a polymer comprising recurring units derived from a (meth)acrylamide, vinyl imidazole, N-(meth)acryloyltetrazole, vinyl pyrrolidone, or mixtures thereof, and the hydrophilic shell polymer is covalently bonded to the hydrophobic core polymer through reactive (meth)acrylic acid groups in the hydrophobic core polymer.

In other embodiments, the shell polymer is derived from one or more of (meth)acrylic acid, sulfonated (meth)acrylate, phosphate (meth)acrylate, vinyl phosphonic acid, or mixtures thereof and, and in combination with one or more (meth) acrylamides.

The shell may also be formed using monomers that crosslink in the shell in a way that allows the shell to remain swellable in aqueous solutions. Such monomers include but are not limited to, divinyl benzene, bis-methacrylates such as ethylene glycol dimethacrylate and other crosslinking moieties known in the art.

It is desirable that the hydrophilic shell polymer be covalently bonded to the hydrophobic core polymer that can be achieved for example by grafting the shell polymer to the core polymer.

The shell thickness is generally from about 1 to about 5 nm and generally comprises from about 5 to about 25% of the volume of the core-shell particles, on average (some particles may be less than 5% and others more than 25%, but the average volume is within the noted range). The shell is believed to entirely cover the core of most or all particles, but there may be some particles in which the shell only partially covers the core.

The resulting core-shell particles generally have an average particle size of from about 10 to about 250 nm or from about 20 to about 150 nm. The particle sizes can be measured using high resolution SEM.

The core-shell particles are generally prepared by emulsion or suspension polymerization using known reactants and conditions to provide an initial dispersion. After a suitable period of reaction, monomers and free radical initiators are added to the dispersion to form the shell polymer(s) around the individual polymer cores. The core-shell dispersions may be naturally stable from sedimentation, or surfactants can be added to stabilize the core-shell particles for a suitable time.

The colorant described above can be present in either the core or shell of the core-shell polymer particles, or in both the core and shell, to provide the desired amount of colorant as described above. Usually, most of the colorant is in the core of the particles.

Some polymers used to form the shells may be highly water soluble, and so the resulting dispersions may also include free "shell" polymer suspended in the reaction medium. Other polymers used to form the shells are less water soluble and very little or no free polymer is suspended in the reaction medium. Such polymers are useful because removal of free polymer is not necessary.

In some embodiments, the imageable element is a lithographic printing plate precursor and has an aluminum-containing substrate having a hydrophilic surface, the coalesceable polymeric particles are core-shell particles comprising at least 50 weight % of the total imageable layer dry weight and have an average particle size of from about 10 to about 100 nm, the element comprises an optional infrared radiation absorbing compound that is present in the single thermally-sensitive imageable layer in an amount of from about 1 to about 30%, based on the total imageable layer dry weight, and the colorant is present in the shell or core, or both, of the particles in an amount of from about 0.1 to about 30 weight % based on total polymeric particle weight.

In still other embodiments, the shell of the core-shell particles has an average thickness of from about 1 to about 5 nm and comprises from about 5 to about 25% of the volume of the core-shell particles, on average, the shell comprises a polymer comprising recurring units derived from a (meth)acrylamide, vinyl imidazole, N-(meth) acryloyltetrazole, vinyl pyrrolidone, or mixtures thereof, the hydrophilic shell polymer is covalently bonded to the hydrophobic core polymer through reactive (meth)acrylic acid groups in the hydrophobic core polymer, the core has an average size of from about 10 to about 100 nm, and the colorant is present in the shell, core, or both in an amount of from about 0.1 to about 30 weight % based on the total weight of the polymeric particles.

Imageable Elements

The imageable elements include the coalesceable polymeric particles described above in the single and outermost imageable layer.

In general, single-layer imageable elements are formed by suitable application of an imageable layer formulation containing the coalesceable polymeric particles to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof. Aluminum-containing substrates are most common.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support having a hydrophilic surface that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

The imageable element also includes one or more radiation absorbing compounds. While these compounds can be sensitive to any suitable energy form (for example, UV or visible radiation), they are usually sensitive to infrared radiation and thus, the radiation absorbing compounds can be infrared radiation absorbing compounds ("IR absorbing compounds") that absorb radiation from about 600 to about 1600 nm and typically from about 700 to about 1200 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S. Patent Application Publication 2005-0130059 (Tao). A general description of one class of suitable cyanine dyes is shown by the formula in paragraph 0026 of WO 2004/101280 (Munnelly et al.).

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes may be formed using conventional methods and starting materials or obtained from various commercial sources. Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount sufficient to render the thermally-sensitive imageable layer insoluble to an aqueous developer after exposure to appropriate radiation. This amount is generally at least 1% and up to 30 weight % and typically from about 5 to about 20 weight % (based on total dry imageable layer weight). The particular amount needed for this purpose would be readily apparent to one skilled in the art, depending upon the specific compound used and the properties of the alkaline developer to be used. In most embodiments, the radiation absorbing compound is present in the single imageable layer containing the coalesceable polymeric particles. Alternatively or additionally, radiation absorbing compounds may be located in a separate layer that is in thermal contact with the single imageable layer. Thus, during imaging, the action of the radiation absorbing compound can be transferred to the imageable layer without the compound originally being incorporated into it.

The imageable layer includes the coalesceable polymeric particles described above in a sufficient amount generally to provide at least 50 weight %, and typically from about 60 to about 99 weight % of the total imageable layer dry weight.

An imageable layer comprising the polymeric particles (usually in an aqueous dispersion), one or more radiation-sensitive compounds and any other additives (described below), can be prepared by dispersing the components in a suitable solvent medium (described below).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

In some embodiments, the imageable layer is free of polymeric binders as the thermoplastic polymer of the polymeric particles, and especially the shell of the core-shell particles, may act as a binder in the layer once solvents are removed due to the particular polymers chosen to prepare the particles. However, in other embodiments free polymeric binder(s) may be present in an amount of up to 50%, typically less than 30%, and more typically less than 20%, based on the dry imageable layer weight.

In some embodiments, the thermally-sensitive imageable layer containing the coalesceable polymeric particles is soluble or dispersible in water.

The single-layer imageable element can be prepared by applying the layer formulation over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be from about 0.2 to about 2 g/m$^2$ and typically from about 0.4 to about 1 g/m$^2$.

The selection of solvents used to coat the imageable layer formulation depends upon the nature of the polymeric particles and other components in the formulations. Generally, the imageable layer formulation is coated out of acetone, methanol, or an aqueous solution containing methanol, ethanol, isopropyl alcohol, n-propanol, n-butanol, and mixtures thereof using conditions and techniques well known in the art.

Intermediate drying steps may be used between applications of the various layer formulations to remove solvent(s) before coating other formulations. Drying steps may also help in preventing the mixing of the various layers.

The imageable layer can also include one or more contrast dyes that are not present in the coalesceable polymeric particles. Such contrast dyes include but are not limited to, crystal violet, methyl violet, ethyl violet, Victoria Blue B, Victoria Blue R, malachite green, and brilliant green.

Imaging and Development

The single-layer imageable elements can have any useful form including, but not limited to, printing plate precursors, printing cylinders, printing sleeves (solid or hollow cores) known as rotary printing members, and printing tapes (including flexible printing webs). For example, the imageable members can be printing plate precursors useful for providing lithographic printing plates having hydrophilic substrates.

During use, the single-layer imageable elements are exposed to a suitable source of thermal energy such as infrared radiation, depending upon the radiation absorbing compound present in the element, for example at a wavelength of from about 700 to about 1600 nm. In some embodiments, imaging can be carried out using an infrared laser at a wavelength of from about 700 to about 1400 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 100 to about 1500 mJ/cm$^2$, and typically from about 100 to about 400 mJ/cm$^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) regions with coalesced polymeric particles and non-imaged (non-exposed) regions where the polymeric particles are not coalesced to any appreciable extent. Developing the imaged element with a suitable aqueous solution (described below) removes usually only the non-exposed regions of the imageable layer and the underlying portions of any underlayer and exposes the hydrophilic surface of the substrate. Polymeric particles coalesced from the thermal imaging remain in the exposed regions. Thus, the imageable elements are "negative-working" (for example, negative-working lithographic printing plate precursors). The non-exposed (or non-imaged) regions of the hydrophilic surface repel ink while the exposed (or imaged) regions remaining in the element accept ink.

The imaged elements are developed using an aqueous solution such as plain water or an aqueous solution having a pH of 3 or more and typically from about 10 to about 14 and containing one or more salts of acidic polymers such as poly(vinyl phosphonic acid), polymeric phosphoric acids, poly(meth)acrylic and copolymers thereof, copolymers containing maleic acid or other polymeric carboxylic acids where the carboxy groups are partially or fully neutralized, or a mixture thereof.

Development can be carried out in conventional processing equipment such as Mercury Mark 6 processors (Eastman Kodak Company) or single bath developers ("Two in One Processor"), which equipment may include rollers or brushes to facilitate the removal of non-exposed regions in the imaged element.

Alternatively, the imaged elements can be developed by applying a gum solution that generally has a pH of from about 3 to about 8, and includes one or more surface protective compounds that are capable of protecting the developed image against contamination or damage. Examples of such compounds include but are not limited to, film-forming hydrophilic polymer and surfactants that are commonly known in the art for this purpose.

Following development, the imaged element can be dried in a suitable fashion. The dried element can also be treated with a conventional finishing gum solution (for example, containing gum arabic).

A lithographic ink and fountain solution can be applied to the printing surface of the imaged element for printing. The exposed regions of the outermost imaged layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following embodiments are representative of the present invention but the present invention is not limited to just these embodiments:

Embodiment 1: An imageable element comprising a hydrophilic substrate, and having thereon a single thermally-sensitive imageable layer comprising an infrared radiation absorbing compound and polymeric particles that coalesce upon thermal imaging, and optionally an infrared radiation absorbing compound, wherein the polymeric particles comprise a thermoplastic polymer and a colorant.

Embodiment 2: The element of embodiment 1 wherein the colorant is an IR dye or a contrast dye, or both.

Embodiment 3: The element of embodiment 1 or 2 wherein the colorant has a $\lambda_{max}$ of from about 350 to about 700 nm and is a cyanine, anthraquinone, phthalocyanine, di- or triarylmethane, diazonium, styryl, meso-styryl, oxazine, or rhodamine dye.

Embodiment 4: The element of any of embodiments 1 to 3 wherein the colorant is covalently bonded to the backbone of the thermoplastic polymer, or is a part of the backbone.

Embodiment 5: The element of any of embodiments 1 to 4 wherein the colorant is present in the polymeric particles in an amount of at least 0.1 weight %.

Embodiment 6: The element of any of embodiments 1 to 5 wherein the thermoplastic polymer has a glass transition temperature greater than 40° C.

Embodiment 7: The element of any of embodiments 1 to 6 wherein the thermoplastic polymer comprises a polystyrene, poly(meth)acrylate, polymethylenelactone, polyvinyl chloride, poly(meth)acrylonitriles, polyvinyl ester, polysulfone, polycarbonate, polyurethane, polyamide, or a copolymer thereof.

Embodiment 8: The element of any of embodiments 1 to 7 wherein the polymeric particles have an average particle size of from about 5 to about 250 nm.

Embodiment 9: The element of any of embodiments 1 to 8 wherein the polymeric particles are polymeric core-shell particles having a hydrophilic shell.

Embodiment 10: The element of any of embodiments 1 to 9 wherein the polymeric particles comprise at least 50 weight % of the imageable layer, based on total dry weight.

Embodiment 11: A method of providing an image comprising:

A) thermally imaging the imageable element of any of embodiments 1 to 10 to provide an imaged element with exposed regions and non-exposed regions, the exposed regions comprising coalesced polymeric particles, and B) developing the imaged element to remove the non-exposed regions with an aqueous solution.

Embodiment 12: The method of embodiment 11 wherein the imaging is carried out using an infrared laser at a wavelength of from about 700 to about 1400 nm.

Embodiment 13: The method of embodiment 11 or 12 wherein the aqueous solution used for developing has a pH of from about 7 to about 14.

Embodiment 14: The method of any of embodiments 11 to 13 wherein the polymeric particles comprise a thermoplastic polymer that comprises a polystyrene, poly(meth)acrylate, polymethylenelactone, polyvinyl chloride, poly(meth)acrylonitriles, polyvinyl ester, polysulfone, polycarbonate, polyurethane, polyamide, or a copolymer thereof.

Embodiment 15: The method of any of embodiments 11 to 14 wherein the colorant has a $\lambda_{max}$ of from about 350 to about 700 nm and is a cyanine, anthraquinone, phthalocyanine, di- or triarylmethane, diazonium, styryl, meso-styryl, oxazine, or rhodamine dye.

Embodiment 16: The method of any of embodiments 11 to 15 wherein the colorant is present in said polymeric particles in an amount of from about 0.1 to about 30 weight %.

Embodiment 17: The method of any of embodiments 11 to 16 wherein the polymeric particles are polymeric core-shell particles having a hydrophilic shell.

Embodiment 18: The method of any of embodiments 11 to 17 wherein the imageable element is a lithographic printing plate precursor having a hydrophilic substrate and an imageable layer, and the polymeric particles comprise at least 50 weight % of the imageable layer and have an average particle size of from about 5 to about 250 nm, the infrared radiation absorbing compound is a infrared radiation dye that is present in the imageable layer in an amount of from about 5 to about 30 weight % based on imageable layer total dry weight.

Embodiment 19: The method of any of embodiments 11 to 18 wherein the imageable element comprises a colorant that is an IR dye.

Embodiment 20: A lithographic printing plate having an aluminum-containing substrate comprising a hydrophilic surface that is prepared by the method of any of embodiments 11 to 19.

The following examples are provided to illustrate the practice of the invention but are by no means intended to limit the invention in any manner.

Comparative Example 1

The following components were used to prepare a Comparative imageable layer core-shell polymer dispersion:

119.24 g of styrene ("S"),
60.76 g of acrylonitrile ("AN"),
800.00 g of water,
20.00 g of ethylene glycol methacrylate phosphate,
12.00 g of sodium dodecyl sulfate (SDS),
2×2.70 g of potassium peroxo disulfate (KPS).

The SDS was dissolved in water and heated to 80° C. The KPS was then added and the S/AN mixture was added slowly under vigorous stirring into the solution. After 2 hours, the second portion of KPS was added and the ethylene glycol methacrylate phosphate was added slowly into the dispersion. After 2 hours, the reaction was completed and the dispersion was cooled down slowly to room temperature.

Inventive Example 1

The following components were used to prepare an inventive imageable layer core-shell polymer dispersion:

119.24 g of styrene, 60.76 g of acrylonitrile, 3.60 g of Solvent Blue 35 (anthraquinone dye), 800.00 g of water, 20.00 g of ethylene glycol methacrylate phosphate, 12.00 g of sodium dodecyl sulfate (SDS), 2×2.70 g of potassium peroxo disulfate (KPS).

The SDS was dissolved in water and heated to 80° C. The KPS was then added and the solution of the Solvent Blue in S/AN mixture was added slowly under vigorous stirring into the solution. After 2 hours, the second portion of KPS was added and the ethylene glycol methacrylate phosphate was added slowly into the dispersion. After 2 hours, the reaction was completed and the resulting deep blue dispersion was cooled down slowly to room temperature.

Negative-working imageable elements were prepared using each of the Comparative Example 1 and Invention Example 1 dispersions using the following Coating Solution:

1.50 g of an IR dye having the following formula:

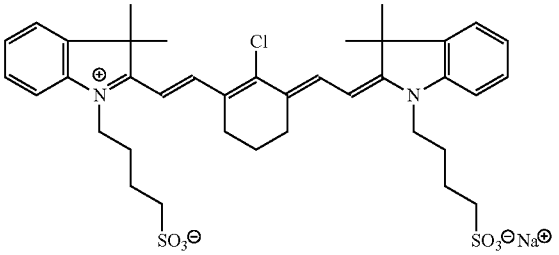

42.50 g of core-shell polymeric particles (from the dispersions described above), 56.00 g of deionized water.

Each coating solution was coated onto a grained and anodized aluminum substrate and dried for 5 minutes at 70° C. to provide single-layer negative-working imageable elements. These imageable elements did not show differences in imaging or printing properties except that Invention Example 1 imageable element had a more intensive color as shown from the data in TABLE I below where the optical density (OD) was measured using an X-Rite spectrophotometer.

Invention Example 2

Invention Example 2 was carried out as in Invention Example 1 but instead of Solvent Blue 35 the following contrast dye was used:

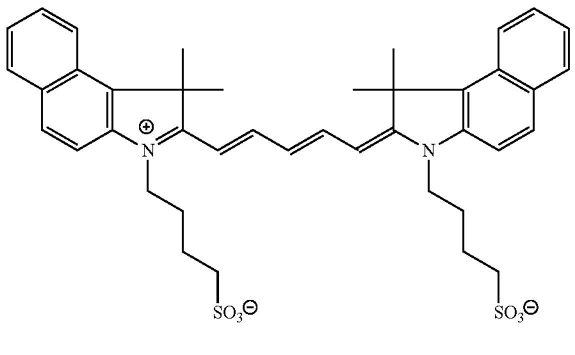

The anion was the one shown in formula C.

Inventive Example 3

Invention Example 3 was carried out as in Invention Example 1 but instead of Solvent Blue 35 the following contrast dye was used:

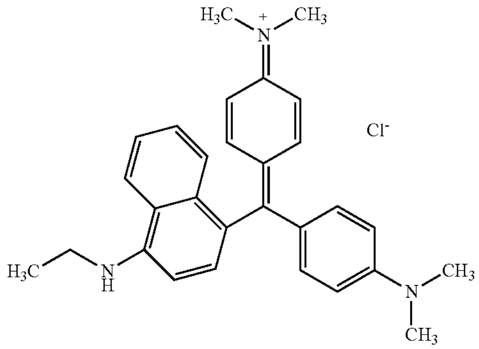

TABLE I below shows the results for the optical densities (OD). It can be seen that the inventive examples show a significant increase of the OD in contrast to the comparative example.

TABLE I

| Example | Plate Color [OD] |
|---|---|
| Inventive Example 1 | 0.47 |
| Inventive Example 2 | 0.53 |
| Inventive Example 3 | 0.50 |
| Comparative Example 1 | 0.41 |

Comparative Example 2

A negative-working imageable element was prepared like Comparative Example 1 dispersion using the following Coating Solution:

1.60 g of an IR dye of the formula:

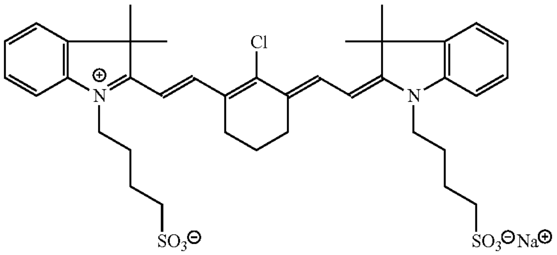

42.50 g of core-shell polymeric particles (from the dispersions described above), 56.00 g of deionized water.

Inventive Example 4

The following components were used to prepare an imageable layer core-shell polymer dispersion:

119.24 g of styrene, 60.76 g of acrylonitrile, 7.20 g of an IR dye of the formula:

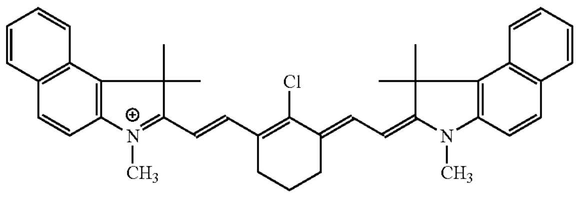 [SMILES: CN1/C(=C/C=C2\CCCC(/C=C/C3=[N+](C)c4ccc5ccccc5c4C3(C)C)=C2Cl)C(C)(C)c2c1ccc1ccccc21]

(the anion of the IR dye was the one shown in formula C), 800.00 g of water, 20.00 g of ethylene glycol methacrylate phosphate, 12.00 g of sodium dodecyl sulphate (SDS), 2×2.70 g of potassium peroxo disulfate (KPS).

The SDS was dissolved in water and heated to 80° C. The KPS was then added and the solution of the Solvent Blue in S/AN mixture was added slowly under vigorous stirring into the solution. After 2 hours, the second portion of KPS was added and the ethylene glycol methacrylate phosphate was added slowly into the dispersion. After 2 hours, the reaction was completed and the resulting deep blue dispersion was cooled down slowly to room temperature.

A negative-working imageable element was prepared using the following Coating Solution:

1.20 g of an IR dye of the formula:

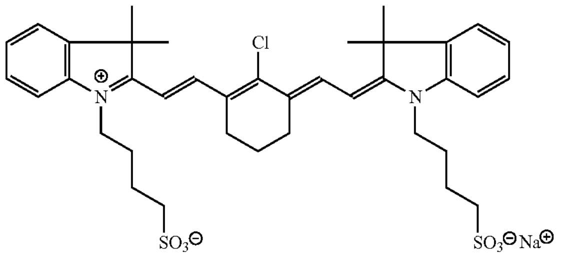

42.50 g of core-shell polymeric particles (from the dispersion described above), 56.00 g of deionized water.

The coating solutions obtained from this example and from comparative example 2 were coated onto a grained and anodized aluminum substrate and dried for 5 minutes at 70° C. to provide single-layer negative-working imageable elements.

These imageable elements did not show differences in imaging or printing properties except that the Invention Example 3 imageable element required significantly less exposure energy to obtain a solid image even though the content of IR was the same in both coatings.

TABLE II

| | Plate Color [OD] | Required energy for solid image after development |
|---|---|---|
| Inventive Example 4 | 0.42 | 275 mJ/cm$^2$ |
| Comparative Example 2 | 0.41 | 313 mJ/cm$^2$ |

Inventive Example 5

The following components were used to prepare an inventive imageable layer core-shell polymer dispersion:

119.24 g of styrene, 60.76 g of acrylonitrile, 800.00 g of water, 16.00 g of ethylene glycol methacrylate phosphate, 4.00 g of a reactive dye shown in the formula below (modified Solvent violet 13), 12.00 g of sodium dodecyl sulfate (SDS), 2×2.70 g of potassium peroxo disulfate (KPS),

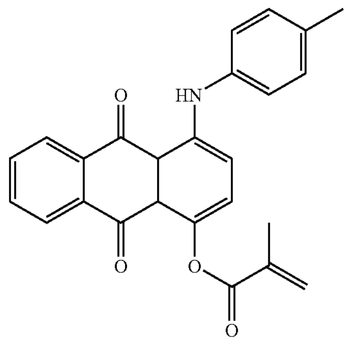 [SMILES: C=C(C)C(=O)OC1=CC=C(Nc2ccc(C)cc2)C2C(=O)c3ccccc3C(=O)C12]

The SDS was dissolved in water and heated to 80° C. The KPS was then added and the solution of the Solvent Blue in S/AN mixture was dropped slowly under vigorous stirring into the solution. After 2 hours, the second portion of KPS was added and the ethylene glycol methacrylate phosphate was added slowly into the dispersion. After 2 hours, the reaction was completed and the resulting deep violet dispersion was cooled down slowly to room temperature.

Negative-working imageable elements were prepared as described in Invention Example 1.

Invention Example 6

The following components were used to prepare an inventive imageable layer core-shell dispersion:

119.24 g of styrene, 60.76 g of acrylonitrile, 3.60 g of Solvent Blue 35 (anthraquinone dye), 800.00 g of water, 12.00 g of sodium dodecyl sulfate (SDS), 2×2.70 g of potassium peroxo disulfate (KPS), 20.00 g of poly(acrylic acid) (Mw 40,000).

The SDS was dissolved in water and heated to 80° C. The KPS was then added and the solution of the Solvent Blue in the S/AN mixture was added slowly under vigorous stirring into the solution. After two hours, the reaction was completed. The poly(acrylic acid) was added to the resulting deep blue dispersion. The solution was cooled down slowly to room temperature.

Negative-working imageable elements were prepared by using the coating solution procedure described in Invention Example 1.

Invention Example 7

The following components were used to prepare an inventive imageable layer core-shell dispersion:

119.24 g of styrene, 60.76 g of acrylonitrile, 3.60 g of Solvent Blue 35 (anthraquinone dye), 800.00 g of water, 12.00 g of sodium dodecyl sulfate (SDS), 2×2.70 g of potassium peroxo disulfate (KPS).

The SDS was dissolved in water and heated to 80° C. The KPS was then added and the solution of the Solvent Blue in the S/AN mixture was added slowly under vigorous stirring into the solution. After two hours, the reaction was completed. The resulting deep blue dispersion was cooled down slowly to room temperature.

Negative-working imageable elements were prepared by using the coating solution procedure described in Invention Example 1.

TABLE III below shows the results for the optical densities (OD). It can be seen that the inventive examples show a significant increase of the OD in contrast to the comparative example.

TABLE III

| Example | Plate Color [OD] |
|---|---|
| Invention Example 5 | 0.46 |
| Invention Example 6 | 0.45 |
| Invention Example 7 | 0.46 |
| Comparative Example 1 | 0.41 |

The invention has been described in detail with particular reference to certain preferred embodiments thereof, but it will be understood that variations and modifications can be effected within the spirit and scope of the invention.

The invention claimed is:

1. An imageable element comprising a hydrophilic substrate, and having thereon a single thermally-sensitive imageable layer comprising polymeric particles that coalesce upon thermal imaging, and optionally an infrared radiation absorbing compound, wherein said polymeric particles comprise a thermoplastic polymer and a colorant, and the polymeric particles are polymeric core-shell particles having a hydrophilic shell and at least 50 weight % of all colorants that are in the single thermally-sensitive imageable layer are in the polymeric particles, wherein said thermoplastic polymer has a glass transition temperature greater than 40° C., and wherein said colorant is covalently bonded to the backbone of said thermoplastic polymer or is a part of said backbone.

2. The element of claim 1 wherein said colorant is an IR dye or a contrast dye, or both.

3. The element of claim 1 wherein said colorant has a $\lambda_{max}$ of from about 350 to about 700 nm and is a cyanine, anthraquinone, phthalocyanine, di- or triarylmethane, diazonium, styryl, meso-styryl, oxazine, or rhodamine dye.

4. The element of claim 1 wherein said colorant is present in said polymeric particles in an amount of at least 0.1 weight %.

5. The element of claim 1 wherein said thermoplastic polymer comprises a polystyrene, poly(meth)acrylate, polymethylenelactone, polyvinyl chloride, poly(meth)acrylonitriles, polyvinyl ester, polysulfone, polycarbonate, polyurethane, polyamide, or a copolymer thereof.

6. The element of claim 1 wherein said polymeric particles have an average particle size of from about 5 to about 250 nm.

7. The element of claim 1 wherein said polymeric particles comprise at least 50 weight % of said imageable layer, based on total dry weight.

8. A method of providing an image comprising:

A) thermally imaging the imageable element of claim 1 to provide an imaged element with exposed regions and non-exposed regions, said exposed regions comprising coalesced polymeric particles, and B) developing said imaged element to remove said non-exposed regions with an aqueous solution.

9. The method of claim 8 wherein said imaging is carried out using an infrared laser at a wavelength of from about 700 to about 1400 nm.

10. The method of claim 8 wherein said aqueous solution used for developing has a pH of from about 7 to about 14.

11. The method of claim 8 wherein said polymeric particles comprise a thermoplastic polymer that comprises a polystyrene, poly(meth)acrylate, polymethylenelactone, polyvinyl chloride, poly(meth)acrylonitriles, polyvinyl ester, polysulfone, polycarbonate, polyurethane, polyamide, or a copolymer thereof.

12. The method of claim 8 wherein said colorant has a $\lambda_{max}$ of from about 350 to about 700 nm and is a cyanine, anthraquinone, phthalocyanine, di- or triarylmethane, diazonium, styryl, meso-styryl, oxazine, or rhodamine dye.

13. The method of claim 12 wherein said colorant is present in said polymeric particles in an amount of from about 0.1 to about 30 weight %.

14. The method of claim 8 wherein said imageable element is a lithographic printing plate precursor having a hydrophilic substrate and an imageable layer, and said polymeric particles comprise at least 50 weight % of said imageable layer and have an average particle size of from about 5 to about 250 nm, said infrared radiation absorbing compound is a infrared radiation dye that is present in said imageable layer in an amount of from about 5 to about 30 weight % based on imageable layer total dry weight.

15. The method of claim 8 wherein said imageable element comprises a colorant that is an IR dye.

* * * * *